United States Patent
Fu

(10) Patent No.: US 10,633,247 B2
(45) Date of Patent: Apr. 28, 2020

(54) SEMICONDUCTOR DEVICE AND MANUFACTURE THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: GuangCai Fu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 16/432,269

(22) Filed: Jun. 5, 2019

(65) Prior Publication Data

US 2019/0284044 A1 Sep. 19, 2019

Related U.S. Application Data

(63) Continuation of application No. 15/923,648, filed on Mar. 16, 2018, now Pat. No. 10,351,421.

(30) Foreign Application Priority Data

Mar. 17, 2017 (CN) .......................... 2017 1 0158486

(51) Int. Cl.
*B81C 1/00* (2006.01)
*B81B 3/00* (2006.01)
(Continued)

(52) U.S. Cl.
CPC ........ *B81C 1/00301* (2013.01); *B81B 3/0005* (2013.01); *B81B 7/007* (2013.01);
(Continued)

(58) Field of Classification Search
CPC ............. B81C 1/00301; B81C 1/00968; G01P 15/0802; G01P 15/125; B81B 7/007; B81B 3/0005
See application file for complete search history.

(56) References Cited

U.S. PATENT DOCUMENTS

2017/0210612 A1 7/2017 Chen et al.
2018/0230001 A1 8/2018 Chang et al.

OTHER PUBLICATIONS

Zhou et al., "Facet Passivation of GaAs Based LDs by N2 Plasma Pretreatment and Rf Sputtered AlxNy Film Coating", Journal of Lightwave Technology, vol. 31, No. 13, Jul. 1, 2013, pp. 2279-2283.
(Continued)

*Primary Examiner* — Anthony Ho
(74) *Attorney, Agent, or Firm* — Innovation Counsel LLP

(57) ABSTRACT

A semiconductor device and its manufacturing method, relating the semiconductor techniques. The semiconductor device manufacturing method comprises: providing a first semiconductor structure, wherein the first semiconductor structure comprises a first part comprising a plurality of films separated from each other, and a first bonding component on the first part; forming an anti-stick layer on the first part covering the plurality of films; providing a second semiconductor structure comprising a second part and a second bonding component on the second part; and bonding the first bonding component with the second bonding component, so that the first part is bonded to the second part. This inventive concept prevents the adhesion of neighboring films in a semiconductor device.

12 Claims, 6 Drawing Sheets

(51) Int. Cl.
*B81B 7/00* (2006.01)
*G01P 15/125* (2006.01)
*G01P 15/08* (2006.01)

(52) U.S. Cl.
CPC ...... *B81C 1/00968* (2013.01); *G01P 15/0802* (2013.01); *G01P 15/125* (2013.01); *B81B 2201/0235* (2013.01); *B81B 2207/012* (2013.01); *B81C 2201/112* (2013.01); *B81C 2203/035* (2013.01); *B81C 2203/0792* (2013.01)

(56) References Cited

OTHER PUBLICATIONS

Zhuang et al., "Vapor-Phase Self-Assembled Monolayers for Anti-Stiction Applications in MEMS", Journal of Microelectromechanical Systems, vol. 16, No. 6, Dec. 2007, pp. 1451-1460.

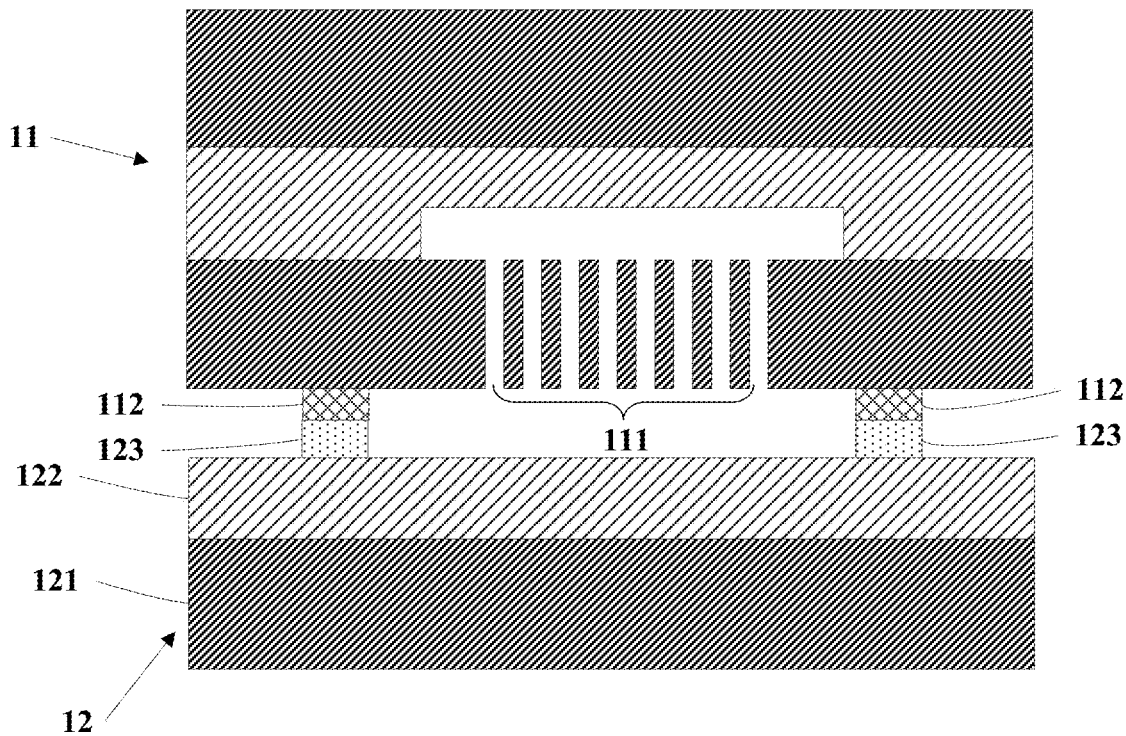

Fig. 1C

```
                    ┌─────────────────────────────────────┐
                    │ provide a first semiconductor device │
                    │  that comprises a first part        │
                    │  comprising a plurality of films    │──── S202
                    │  separated from each other, and a   │
                    │  first bonding component on the     │
                    │  first part                          │
                    └─────────────────────────────────────┘
                                    │
                                    ▼
                    ┌─────────────────────────────────────┐
                    │  form an anti-stick layer on the    │
                    │  first part covering the plurality  │──── S204
                    │  of films                           │
                    └─────────────────────────────────────┘
                                    │
                                    ▼
                    ┌─────────────────────────────────────┐
                    │  provide a second semiconductor     │
                    │  structure comprising a second part │──── S206
                    │  and a second bonding component on  │
                    │  the second part                    │
                    └─────────────────────────────────────┘
                                    │
                                    ▼
                    ┌─────────────────────────────────────┐
                    │  bond the first bonding component   │
                    │  with the second bonding component, │──── S208
                    │  so that the first part is bonded   │
                    │  with the second part               │
                    └─────────────────────────────────────┘
```

Fig. 2

SEMICONDUCTOR DEVICE AND MANUFACTURE THEREOF

CROSS-REFERENCE TO RELATED APPLICATION

This application is a continuation application of U.S. patent application Ser. No. 15/923,648 filed on Mar. 16, 2018, which claims priority to Chinese Patent Application No. 201710158486.5 filed on Mar. 17, 2017, and all the benefits accruing therefrom under 35 U.S.C. § 119, the contents of the prior applications being herein incorporated by reference.

BACKGROUND

(a) Field of the Invention

This inventive concept relates generally to semiconductor techniques, and more specifically, to a semiconductor device and its manufacturing method.

(b) Description of the Related Art

Aluminum-germanium (Al—Ge) bonding is a common procedure in Micro Electro Mechanical System (MEMS) device manufacturing processes such as an inertia sensor manufacturing process. FIGS. 1A, 1B, and 1C show schematic sectional views illustrating different stages of a conventional inertia sensor manufacturing process involving an Al—Ge bonding process. Referring to FIG. 1A, the inertia sensor comprises a first part 11 comprising a plurality of films 111 for acceleration sensing and an aluminum (Al) bonding component 112. Referring to FIG. 1B, the inertia sensor further comprises a second part 12 comprising a Complementary Metal Oxide Semiconductor (CMOS) device 121, an insulation layer 122 and a germanium (Ge) bonding component 123 on the insulation layer 122. Referring to FIG. 1C, the aluminum bonding component 112 bonds to the germanium bonding component 123, so that the first part 11 become bonded to the second part 12 to form an inertia sensor.

In the inertia sensors formed with conventional manufacturing methods, neighboring films 111 may adhere with each other and cause malfunction of the sensor.

SUMMARY

The inventor of this inventive concept investigated the issues in conventional techniques and proposed an innovative solution that remedies at least some issues of the conventional methods.

This inventive concept first presents a semiconductor device manufacturing method, comprising:
providing a first semiconductor structure, comprising:
a first part comprising a plurality of films separated from each other; and
a first bonding component on the first part,
forming an anti-stick layer on the first part covering the plurality of films;
providing a second semiconductor structure comprising a second part and a second bonding component on the second part; and
bonding the first bonding component with the second bonding components, so that the first part is bonded the second part.

Additionally, in the aforementioned method, forming an anti-stick layer on the first part may comprise:
applying a plasma treatment on the first bonding component to form a protection layer on the first bonding component;
forming an anti-stick layer on the first part and the first bonding component, with the anti-stick layer covering the films and the protection layer; and
removing the anti-stick layer on the protection layer.

Additionally, in the aforementioned method, the plasma treatment may be conducted under the following conditions: a plasma reaction chamber is filled with nitrogen that has a concentration in a range of 40% to 60%, the pressure inside the plasma reaction chamber is in a range of 0.35 Pa to 1 Pa, a Radio Frequency (RF) power is in a range of 150 W to 300 W, and a bias voltage is in a range of −310V to −290V,
and the protection layer may be a nitrogen-containing metal compound layer.

Additionally, in the aforementioned method, the anti-stick layer on the protection layer may be removed by a heating process.

Additionally, in the aforementioned method, a temperature range for the heating process may be 360° C. to 440° C.

Additionally, in the aforementioned method, the first bonding component may be made of aluminum, and the second bonding component may be made of germanium.

Additionally, in the aforementioned method, the anti-stick layer may be made of perfluorodecyltrichlorosilane (FDTS, $CF_3(CF_2)_7(CH_2)_2SiCl_3$).

Additionally, in the aforementioned method, the first part may further comprise:
a substrate;
a first insulation layer on the substrate; and
a support component on the first insulation layer surrounding and connecting to the plurality of films, wherein the first insulation layer, the support component and the plurality of films form a cavity, and neighboring films are spaced apart from each other to form gaps connecting to the cavity,
and when forming an anti-stick layer on the first part, the anti-stick layer may be formed on the plurality of films through the gaps.

Additionally, in the aforementioned method, the first part may further comprise:
a first contact component on a side of the first insulation layer facing the cavity; and
a first conductive through-hole component going through the support component and a portion of the first insulation layer and connecting to the first contact component, with the first bonding component on the support component and connecting to the first conductive through-hole component.

Additionally, in the aforementioned method, the second part may comprise:
a Complementary Metal Oxide Semiconductor (CMOS) device;
a second insulation layer on the CMOS device, with the second bonding component on the second insulation layer;
a third insulation layer on a bottom surface of the CMOS device;
a second contact component on the third insulation layer;
a second conductive through-hole component going through the CMOS device and the third insulation layer and connecting to the second contact component; and
a metal layer in the second insulation layer, with the CMOS device, the second conductive through-hole component, and the second bonding component each connecting to the metal layer.

This inventive concept further presents a semiconductor device, comprising:

a first part comprising a plurality of films separated from each other;

a first bonding component on the first part;

an anti-stick layer on the first part covering the plurality of films;

a second part; and a second bonding component on the second part, with the second bonding component bonded to the first bonding component.

Additionally, in the aforementioned device, the first bonding component may be made of aluminum, and the second bonding component may be made of germanium.

Additionally, in the aforementioned device, the anti-stick layer may be made of perfluorodecyltrichlorosilane (FDTS, $CF_3(CF_2)_7(CH_2)_2SiCl_3$).

Additionally, the aforementioned device may further comprise a protection layer between the first bonding component and the second bonding component.

Additionally, in the aforementioned device, the protection layer may be a nitrogen-containing metal compound layer.

Additionally, in the aforementioned device, the first part may further comprise:

a substrate;

a first insulation layer on the substrate; and a support component on the first insulation layer surrounding and connecting to the plurality of films, wherein the first insulation layer, the support component and the plurality of films form a cavity, and neighboring films are spaced apart from each other to form gaps connecting to the cavity, and wherein the anti-stick layer are formed on the plurality of films through the gaps.

Additionally, in the aforementioned device, the first part may further comprise:

a first contact component on a side of the first insulation layer facing the cavity; and a first conductive through-hole component going through the support component and a portion of the first insulation layer and connecting to the first contact component, with the first bonding component on the support component and connecting to the first conductive through-hole component.

Additionally, in the aforementioned device, the second part may comprise:

a CMOS device;

a second insulation layer on the CMOS device, with the second bonding component on the second insulation layer;

a third insulation layer on a bottom surface of the CMOS device;

a second contact component on the third insulation layer;

a second conductive through-hole component going through the CMOS device and the third insulation layer and connecting to the second contact component; and a metal layer in the second insulation layer, with the CMOS device, the second conductive through-hole component, and the second bonding component each connecting to the metal layer.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

FIGS. 1A, 1B, and 1C show schematic sectional views illustrating different stages of a conventional inertia sensor manufacturing method involving an Al—Ge bonding process.

FIG. 2 shows a flowchart illustrating a semiconductor device manufacturing method in accordance with one or more embodiments of this inventive concept.

DETAILED DESCRIPTION OF THE EMBODIMENTS

Figure 1A:
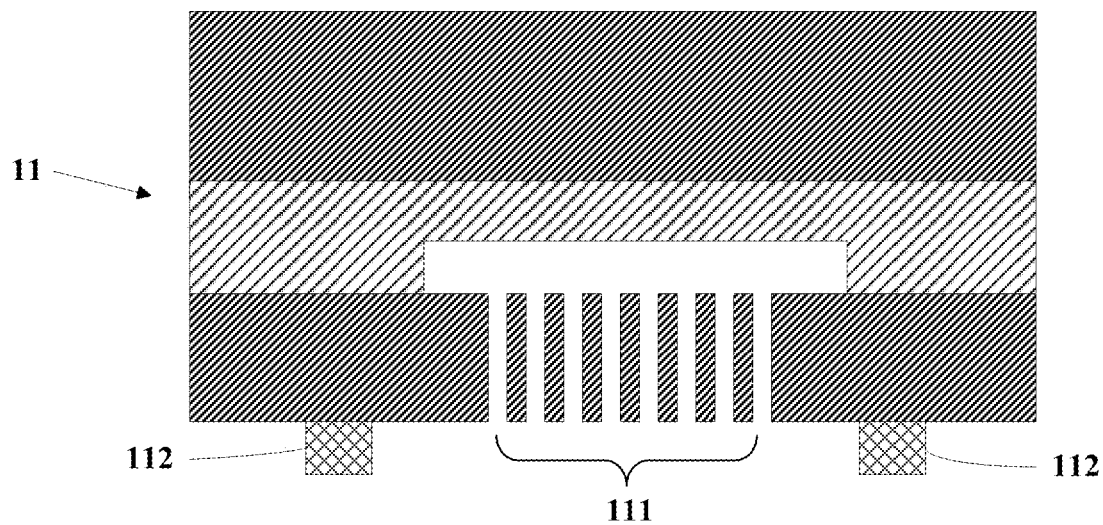
Figure 1B:
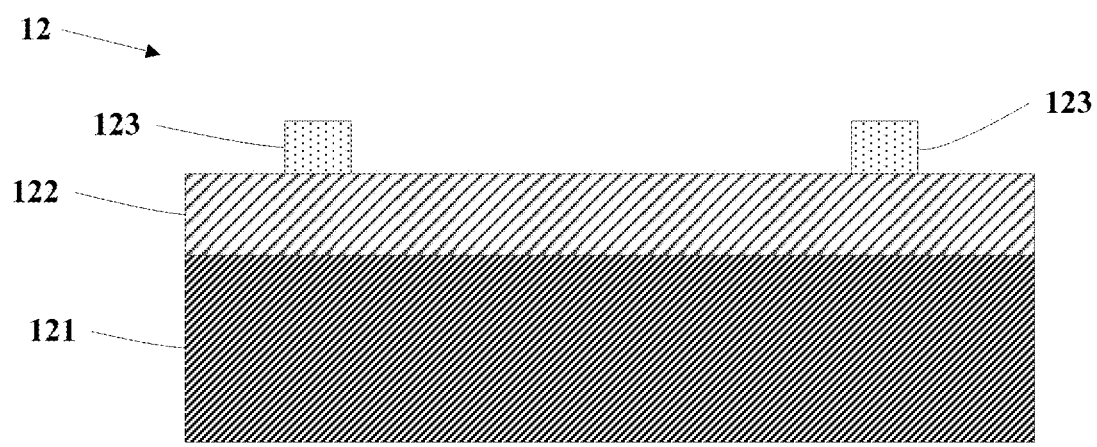

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

The inventive concept is based on the finding that the films in a conventional inertia sensor formed by an Al—Ge bonding process may frequently adhere with each other and cause malfunction of the inertia sensor. For example, when measuring horizontal accelerations, a film in a conventional inertia sensor might be adhered with neighboring films in horizontal direction, and when measuring vertical accelerations, a film might be adhered with neighboring films in vertical direction.

FIG. 2 shows a flowchart illustrating a semiconductor device manufacturing method in accordance with one or more embodiments of this inventive concept.

In step S202, a first semiconductor structure is provided. The first semiconductor structure comprises a first part comprising a plurality of films separated from each other, and a first bonding component on the first part. For example, the first bonding component may be made of aluminum or other bonding materials.

In step S204, an anti-stick layer covering the plurality of films is formed on the first part. The anti-stick layer may be made of perfluorodecyltrichlorosilane (FDTS, $CF_3(CF_2)_7(CH_2)_2SiCl_3$) or other anti-stick materials. In one embodiment, the anti-stick layer does not cover the first bonding component.

In step S206, a second semiconductor structure is provided. The second semiconductor structure comprises a second part and a second bonding component on the second part. The second bonding component may be made of germanium or other bonding materials.

In step S208, the first bonding component bonds to the second bonding component, so that the first part is bonded to the second part.

In this embodiment, an anti-stick layer is formed on the films to prevent the neighboring films from adhering to each other. More specifically, the anti-stick layer prevents a film from adhering with its neighboring films in horizontal or vertical direction.

It should be understood that the order of different steps of this manufacturing method as described above is for description purpose only and is not intended to limit the scope of this inventive concept. Unless explicitly mentioned, different steps of this manufacturing method can also be conducted in an order different from the one described above. For example, step S206 may be conducted before step S202.

The inventor of this inventive concept also discovered that an anti-stick layer (e.g., FDTS) formed on the first bonding component (e.g., aluminum) may impede the bonding between the first bonding component and the second bonding component (e.g., germanium), therefore the anti-stick layer formed on the first bonding component, if there is any, need to be removed, while the anti-stick layer formed on the films will be retained.

Next, the mechanisms that the anti-stick layer can be formed on the first bonding component and the plurality of films are described. In this description, without loss of generality, the anti-stick layer is assumed to be made of FDTS, the first bonding component is assumed to be made of aluminum, and the plurality of films is assumed to be made of silicon. The mechanism the anti-stick layer is formed on the plurality of films is that when two hydroxide ions (—OH) form a water molecular ($H_2O$), the FDTS and silicon form O—Si—O bonds. The mechanism the anti-stick layer is formed on the first bonding component is that when the hydroxide ions (—OH) in the FDTS and $Al(OH)_3$ (aluminum can be easily oxidized to $Al_2O_3$, which in turn is eroded and becomes $Al(OH)_3$) form a water molecular ($H_2O$), the FDTS and aluminum form O—Al—O bonds or O—Al-FDTS bonds. With the bonds between the FDTS and aluminum, the FDTS and aluminum become tightly bonded and are difficult to separate, that might affect the aluminum-germanium bonding process in succeeding stages.

Figure 4:
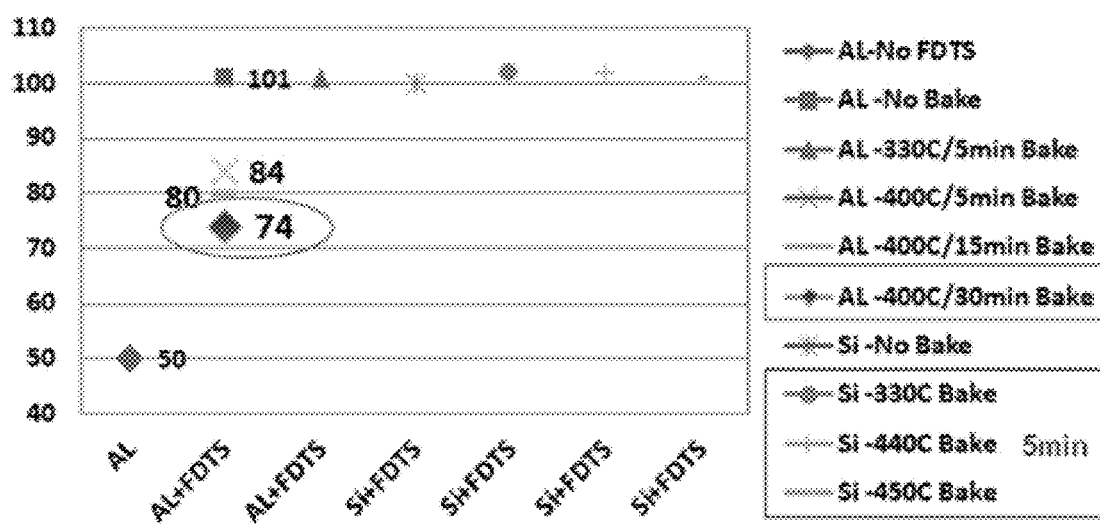
FIG. 4 shows a diagram illustrating the results of a contact angle test on aluminum or silicon under different baking conditions.

FIG. 4 shows a diagram illustrating the test results of a contact angle on aluminum or silicon under different baking conditions. The vertical axis in the diagram represents a contact angle of water on aluminum or silicon (with FTDS on aluminum or silicon), and the horizontal axis represents the bonding condition between aluminum and FDTS, or between silicon and FDTS. Due to the hydrophobic nature of FDTS, the breakdown of FDTS on aluminum or silicon can be measured by the contact angle of water on aluminum or silicon (with FDTS on aluminum or silicon). Water contacting FDTS has a contact angle greater than 50°, so a detected contact angle of greater than 50° means the FDTS has not broken down, and a detected contact angle of less than 50° means that there is no FDTS on aluminum or silicon (i.e., FDTS has broken down). FIG. 4 shows the breakdown of FDTS on aluminum or silicon under different baking conditions. For example, it shows that when baking at 400° C. for 5 minutes, FDTS on aluminum begins to break down, although it has not yet completely broken down at that condition, as indicated by a greater-than-50° contact angle.

In one embodiment, step S204 may comprise applying a plasma treatment on the first bonding component to form a protection layer on the first bonding component. Optionally, step S204 may further comprise forming an anti-stick layer on the first part and on the first bonding component covering the plurality of films and the protection layer. Optionally, step S204 may further comprise removing the anti-stick layer on the protection layer. In this embodiment, a protection layer is formed on the first bonding component through a plasma treatment, the protection layer prevents the first bonding layer and the anti-stick layer from forming a bond, such as an O—Al-FDTS bond, and thus facilitates the removal of the anti-stick layer on the first bonding layer.

For example, the plasma treatment may be conducted under the following conditions: a plasma reaction chamber is filled with nitrogen that has a concentration in a range of 40% to 60% (e.g., 50%), the pressure inside the plasma reaction chamber is in a range of 0.35 Pa to 1 Pa (e.g., 0.5 Pa), a Radio Frequency (RF) power is in a range of 150 W to 300 W (e.g., 200 W), and a bias voltage is in a range of −310V to −290V (e.g., −300V). In this embodiment, a nitrogen-containing metal compound layer (e.g., aluminum nitride ($Al_xN_y$)) may be formed as a protection layer by applying a nitrogen plasma treatment on the first bonding component, the protection prevents the FDTS and the first bonding component from forming an O—Al-FDTS bond, and thus helps to effectively remove any residual anti-stick layer left on the first bonding component.

In one embodiment, the anti-stick layer on the protection layer may be removed by a heating process. For example, the temperature of the heating process may be in a range of 360° C. to 440° C. (e.g., 380° C., 400° C., or 420° C.). The removal of the anti-stick layer on the protection layer facilitates the bonding of the first bonding component with the second bonding component in succeeding stages.

FIGS. 3A, 3B, 3C, 3D, 3E, 3F, and 3G show schematic sectional views illustrating different stages of a semiconductor device manufacturing method in accordance with one or more embodiments of this inventive concept. This semiconductor device manufacturing method is described below with reference to these drawings.

Figure 3A:
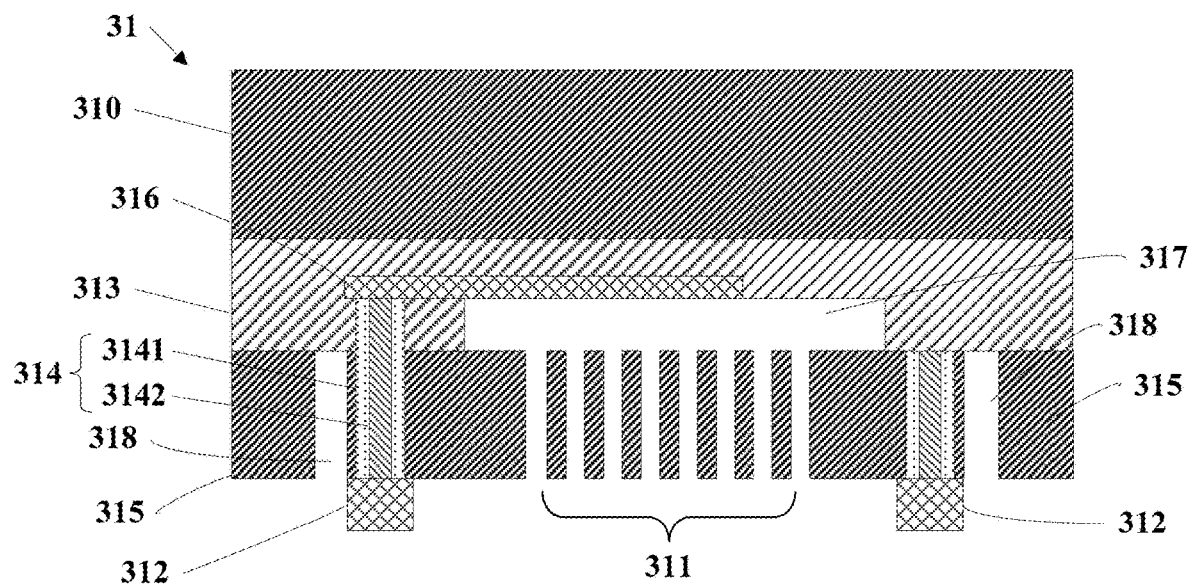
FIGS. 3A, 3B, 3C, 3D, 3E, 3F, and 3G show schematic sectional views illustrating different stages of a semiconductor device manufacturing method in accordance with one or more embodiments of this inventive concept.

First, referring to FIG. 3A, a first semiconductor structure is provided. The first semiconductor structure may comprise a first part 31 and a first bonding component 312 on the first part 31. The first part 31 may comprise a plurality of films 311 separated from each other. The films 311 may be made of silicon, and the first bonding component 312 may be made of aluminum.

Referring to FIG. 3A, in some embodiments, the first part 31 may further comprise a substrate (e.g., a silicon substrate) 310 and a first insulation layer (e.g., a silicon dioxide layer) 313 on the substrate 310. The first part 31 may further comprise a support component 315 (which may be made of silicon) on the first insulation layer 313, with the support component 315 surrounding and connecting to the films 311. The first insulation layer 313, the support component 315 and the films 311 form a cavity 317. Referring to FIG. 3A, neighboring films 311 are spaced apart from each other to form gaps connecting to the cavity 317.

Referring to FIG. 3A, in some embodiments, the first part 31 may further comprise a first contact component 316 (which may be made of aluminum) on a side of the first insulation layer 313 facing the cavity 317, and a first conductive through-hole component 314 going through the support component 315 and a portion of the first insulation layer 313 and connecting to the first contact component 316. For example, a first through-hole may be formed going through the support component 315 and a portion of the first insulation layer 313, and the first conductive through-hole component 314 may comprise a first through-hole insulation layer 3141 (which may be made of silicon dioxide) on a side wall of the first through-hole, and a first through-hole metal component 3142 filling the first through-hole and being wrapped by the first through-hole insulation layer 3141. The first bonding component 312 is on the support component 315 and connecting to the first conductive through-hole component 314.

Referring to FIG. 3A, optionally, the first part 31 may further comprise a third through-hole 318 going through the support component 315. The third through-hole 318 may be used to separate different chips.

Figure 3B:
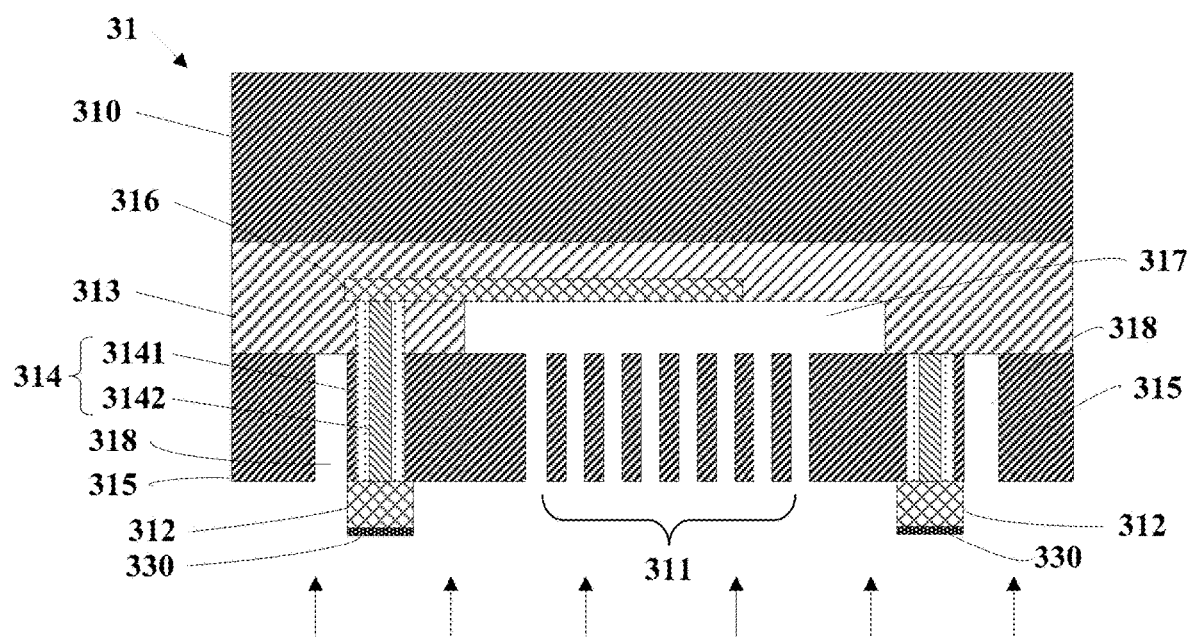

Next, referring to FIG. 3B, a plasma treatment is applied on the first bonding component 312 to form a protection layer 330 on the first bonding component 312. The thickness of the protection layer 330 may be in a range of 50 angstrom to 300 angstrom (e.g., 100 angstrom, 150 angstrom or 200 angstrom). For example, a nitrogen plasma treatment may be applied on the first bonding component 312 to form a nitrogen-containing metal compound layer (e.g., aluminum nitride ($Al_xN_y$)) as a protection layer 330. The protection layer 330 prevents the first bonding component 312 and an anti-stick layer (which will be formed later) from forming O—Al-FDTS bonds, and helps to effectively remove any residual anti-stick layer left on the protection layer 330.

Figure 3C:
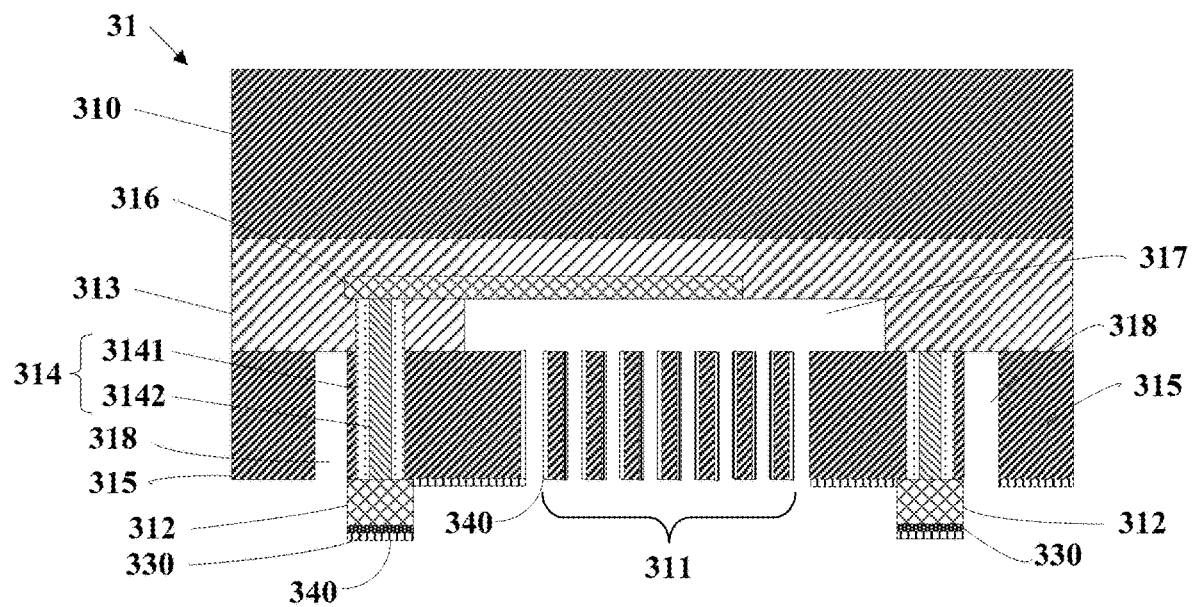

Next, referring to FIG. 3C, an anti-stick layer 340 is formed on the first part 31 and the first bonding component 311 through a molecular vapor deposition process, with the anti-stick layer 340 covering the plurality of films 311 and the protection layer 330. The anti-stick layer 340 may be made of perfluorodecyltrichlorosilane (FDTS, $CF_3(CF_2)_7(CH_2)_2SiCl_3$). Referring to FIG. 3C, in this step, through the gaps between neighboring films, the anti-stick layer 340 may also be formed on the films 311.

Figure 3D:
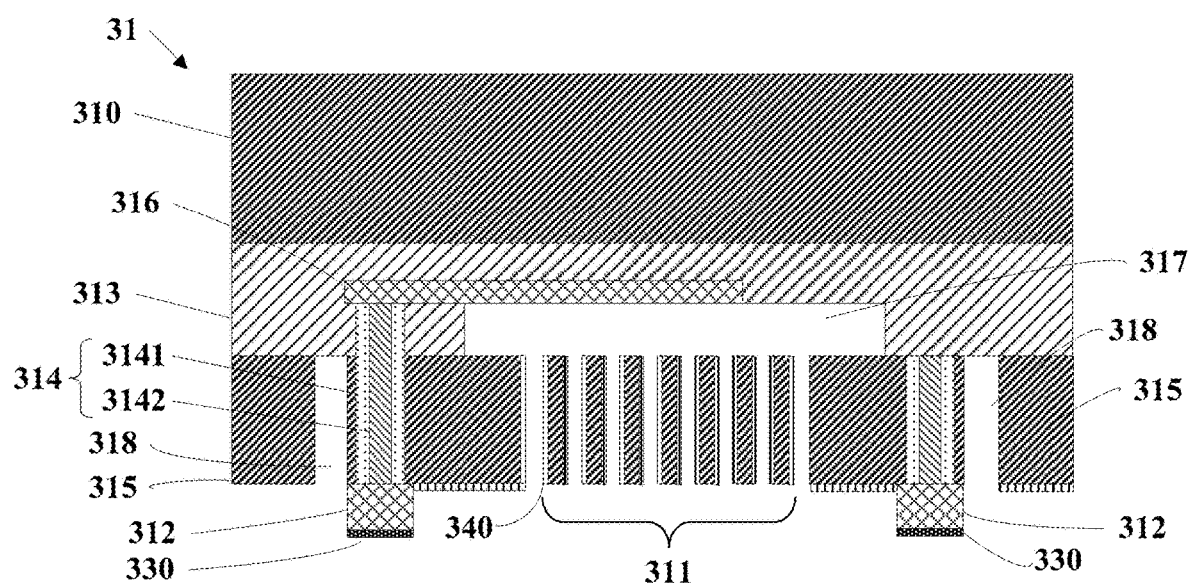

Next, referring to FIG. 3D, the anti-stick layer 340 on the protection layer 330 is removed by a heating process. For example, the temperature of the heating process may be in a range of 360° C. to 440° C. (e.g., 380° C., 400° C., or 420°

C.). At this temperature range, the anti-stick layer 340 on the films 311 will not be removed and will remain on the films 311.

Figure 3E:
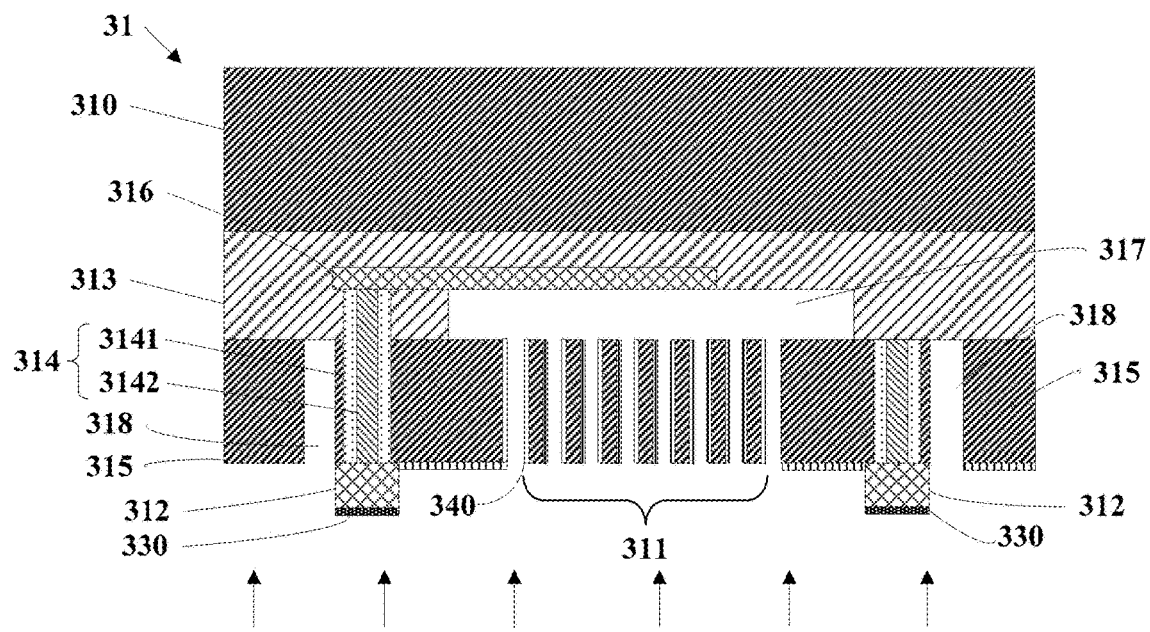

Next, referring to FIG. 3E, optionally, the surfaces of the first bonding component 312, the first part 31, and the anti-stick layer 340 may be cleaned by a plasma treatment. This step facilitates the bonding of the first bonding component 312 and the second bonding component in a succeeding stage.

Figure 3F:
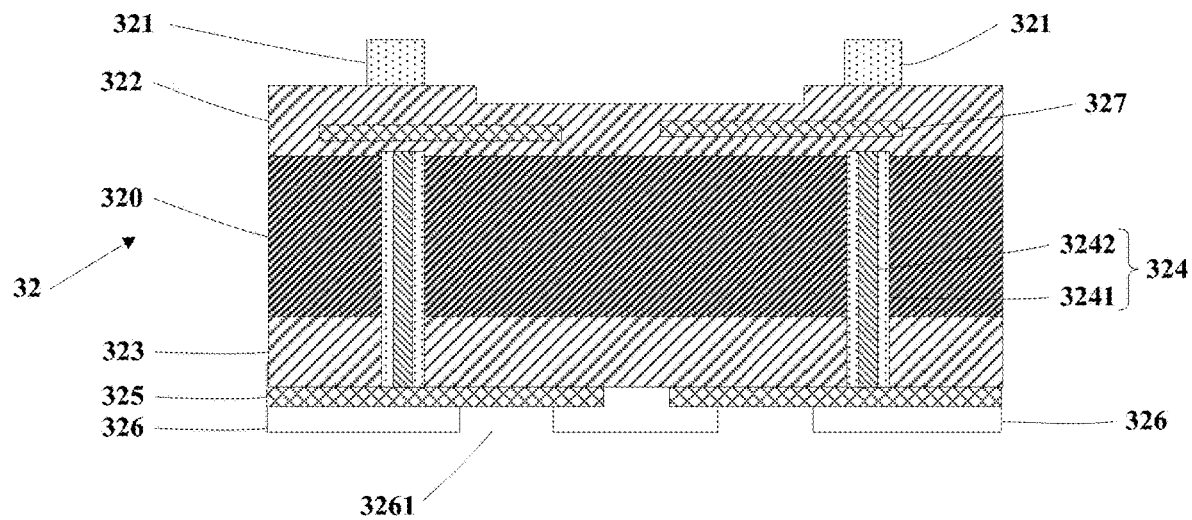

Next, referring to FIG. 3F, a second semiconductor structure is provided. The second semiconductor structure comprises a second part 32 and a second bonding component 321 on the second part 32. For example, the second bonding component 321 may be made of germanium.

Referring to FIG. 3F, in some embodiments, the second part 32 may comprise a CMOS device 320 (which may be formed on a wafer), a second insulation layer (which may be made of silicon dioxide) 322 on the CMOS device 320 with the second bonding component 321 on the second insulation layer 322, a third insulation layer (which may be made of silicon dioxide) 323 on a bottom surface of the CMOS device 320, a second contact component (which may be made of aluminum) 325 on the third insulation layer 323, a second conductive through-hole component 324 going through the CMOS device 320 and the third insulation layer 323 and connecting to the second contact component 325. For example, a second through-hole may be formed going through the CMOS device 320 and the third insulation layer 323, and the second conductive through-hole component 324 may comprise a second through-hole insulation layer (which may be made of silicon dioxide) 3241 on a side wall of the second through-hole and a second through-hole metal component 3242 filling the second through-hole and being wrapped by the second through-hole insulation layer 3241.

Optionally, the second part 32 may further comprise a poly (p-phenylene-2,6-benzobisoxazole) (PBO) layer 326 on a portion of the second contact component 325, the PBO layer 326 has an opening 3261 exposing a portion of the second contact component 325. In a succeeding stage, a ball-placement process may be conducted on the second contact component 325 through the opening 3261.

Optionally, the second part 32 may further comprise a metal (e.g., aluminum or copper) layer 327 in the second insulation layer 322, with each of the CMOS device 320, the second conductive through-hole component 324, and the second bonding component 321 connecting to the metal layer 327. The metal layer 327 may work as metal wires.

Although the accompanying drawings do not show that each of the CMOS device 320, the second conductive through-hole component 324, and the second bonding component 321 is connected to the metal layer 327, a person of ordinary skill in the art would understand that the CMOS device 320, the second conductive through-hole component 324, and the second bonding component 321 may connect to the metal layer 327 at some positions that are not shown in the accompanying drawings.

Figure 3G:
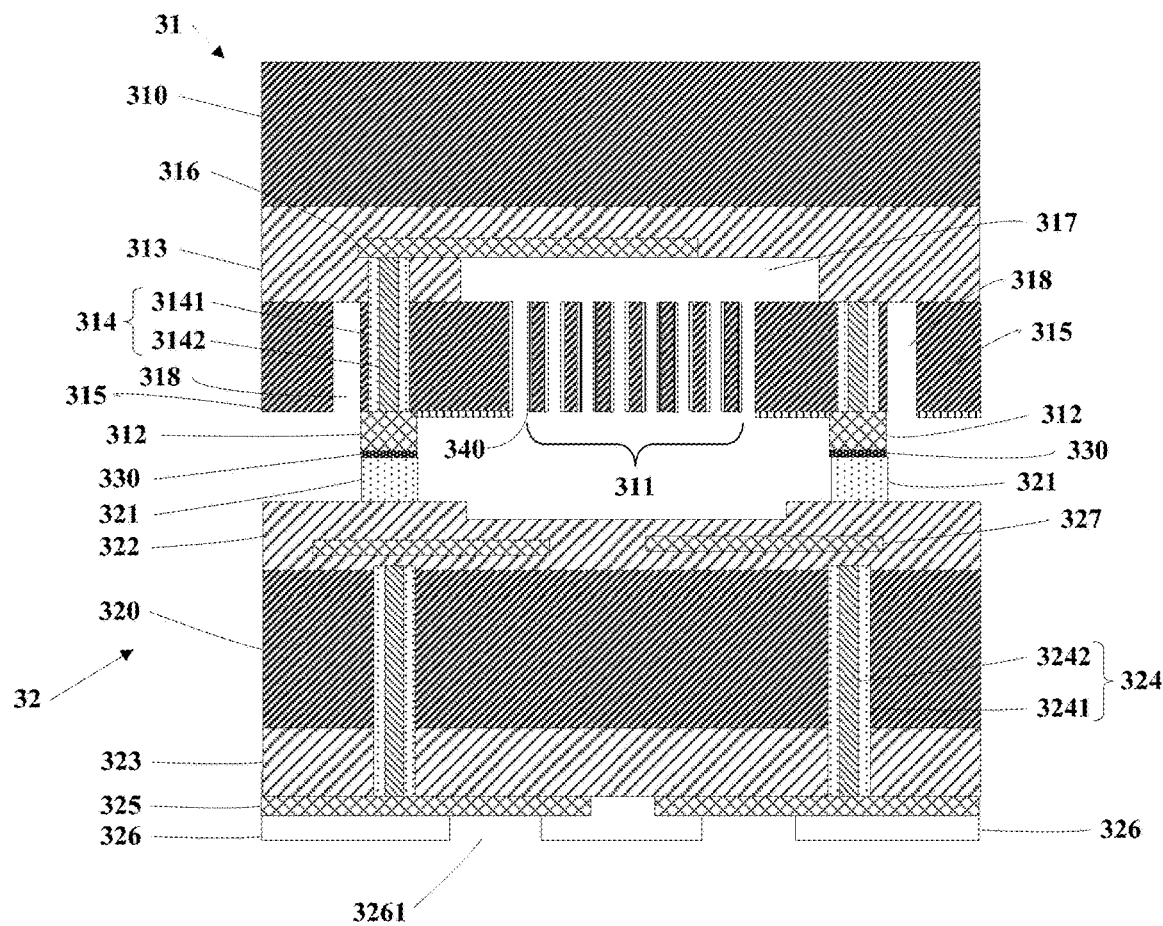

Next, referring to FIG. 3G, the first bonding component 311 bonds to the second bonding component 321, so that the first part 31 becomes bonded to the second part 32, and a semiconductor device, which could be an inertia sensor in accordance with one or more embodiments of this inventive concept, is formed.

This concludes the description of a semiconductor device manufacturing method in accordance with one or more embodiments of this inventive concept. In this method, an anti-stick layer is formed on the plurality of films to prevent the adhesion of neighboring films in a semiconductor device, this solve the adhesion problem of conventional semiconductor devices. Additionally, before the anti-stick layer is formed, a protection layer is formed on the first bonding component through a plasma treatment, which helps to effectively remove any residual anti-stick layer left on the first bonding component, and thus facilitates the bonding of the first bonding component with the second bonding component.

This inventive concept further presents a semiconductor device. Referring to FIG. 3G, the semiconductor device comprises a first part 31 comprising a plurality of films 311 separated from each other, a first bonding component 312 on the first part 31, and an anti-stick layer 340 on the first part 31 covering the plurality of films 311. In one embodiment, the anti-stick layer 340 does not cover the first bonding component 312. The semiconductor device may further comprise a second part 32 and a second bonding component 321 on the second part 32, with the first bonding component 312 bonded to the second bonding component 321.

In this embodiment, the anti-stick layer 340 is formed on the plurality of films 311 to prevent neighboring films from adhering with each other.

For example, the first bonding component 312 may be made of aluminum, the second bonding component 321 may be made of germanium, and the anti-stick layer 340 may be made of perfluorodecyltrichlorosilane (FDTS, $CF_3(CF_2)_7(CH_2)_2SiCl_3$).

Referring to FIG. 3G, in one embodiment, the semiconductor device may further comprise a protection layer 330 between the first bonding component 312 and the second bonding component 321. The protection layer 330 may be a nitrogen-containing metal compound layer (e.g., aluminum nitride ($Al_xN_y$)). The protection layer 330 helps to effectively remove any residual anti-stick layer left on the first bonding component 312 and thus facilitates the bonding of the first bonding component 312 and the second bonding component 321.

Referring to FIG. 3G, in one embodiment, the first part 31 may further comprise a substrate 310, a first insulation layer 313 on the substrate 310, and a support component 315 on the first insulation layer 313, with the support component 315 surrounding and connecting to the plurality of films 311. The first insulation layer 313, the support component 315 and the plurality of films 311 form a cavity 317. Neighboring films 311 are spaced apart from each other to form gaps connecting to the cavity 317, and the anti-stick layer 340 is formed on the plurality of films 311 through the gaps.

Referring to FIG. 3G, in one embodiment, the first part 31 may further comprise a first contact component 316 on a side of the first insulation layer 313 facing the cavity 317, and a first conductive through-hole component 314 going through the support component 315 and a portion of the first insulation layer 313 and connecting to the first contact component 316. For example, a first through-hole may be formed going through the support component 315 and a portion of the first insulation layer 313. The first conductive through-hole component 314 may comprise a first through-hole insulation layer (which may be made of silicon dioxide) 3141 on a side wall of the first through-hole and a first through-hole metal component 3142 filling the first through-hole and being wrapped by the first through-hole insulation layer 3141. The first bonding component 312 is on the support component 315 and connecting to the first conductive through-hole component 314.

Referring to FIG. 3A, optionally, the first part 31 may further comprise a third through-hole 318 going through the support component 315. The third through-hole 318 may be used to separate different chips.

Referring to FIG. 3G, in some embodiments, the second part 32 may comprise a CMOS device 320 that may be formed on a wafer, a second insulation layer (which may be made of silicon dioxide) 322 on the CMOS device 320, with the second bonding component 321 on the second insulation layer 322, a third insulation layer (which may be made of silicon dioxide) 323 on a bottom surface of the CMOS device 320, a second contact component 325 on the third insulation layer 323, a second conductive through-hole component 324 going through the CMOS device 320 and the third insulation layer 323 and connecting the second contact component 325. For example, a second through-hole may be formed going through the CMOS device 320 and the third insulation layer 323, and the second conductive through-hole component 324 may comprise a second through-hole insulation layer (which may be made of silicon dioxide) 3241 on a side wall of the second through-hole and a second through-hole metal component 3242 filling the second through-hole and being wrapped by the second through-hole insulation layer 3241.

Optionally, the second part 32 may further comprise a PBO layer 326 on a portion of the second contact component 325, and the PBO layer 326 has an opening 3261 exposing a portion of the second contact component 325. In a succeeding stage, a ball-placement process may be conducted on the second contact component 325 through the opening 3261.

Optionally, the second part 32 may further comprise a metal (e.g., aluminum or copper) layer 327 in the second insulation layer 322, with each of the CMOS device 320, the second conductive through-hole component 324, and the second bonding component 321 connecting to the metal layer 327. The metal layer 327 may work as metal wires.

The semiconductor device shown in FIG. 3G may work as an inertia sensor to measure accelerations. An acceleration applied on this semiconductor device will result in deformation on the plurality of films 311, which in turn generates a capacitance signal. Through the first contact component 316, the first conductive through-hole component 314, the second bonding component 321, and the metal layer 327, the capacitance signal is transmitted to the CMOS device 320. The CMOS device 320 may be connected to a signal amplifier (not shown in the drawings) that can further process the capacitance signal. Additionally, the capacitance signal may also be transmitted to other external devices through the first contact component 316, the first conductive through-hole component 314, the second bonding component 321, the metal layer 327, the second conductive through-hole component 324, and the second contact component 325. Thus, this inertia sensor may be used to measure, transmit and process acceleration signal.

This concludes the description of a semiconductor device and its manufacturing method in accordance with one or more embodiments of this inventive concept. For purposes of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
   providing a first semiconductor structure, comprising:
      a first part comprising a plurality of films separated from each other, wherein the plurality of films includes a first film and a second film, and wherein a face of the first film is opposite a face of the second film; and
      a first bonding component on the first part;
   forming an anti-stick layer on the first part covering the plurality of films, wherein a portion of the anti-stick layer is positioned between the face of the first film and the face of the second film and directly contacts the face of the first film;
   providing a second semiconductor structure comprising a second part and a second bonding component on the second part; and
   bonding the first bonding component with the second bonding component, so that the first part is bonded to the second part.

2. The method of claim 1, wherein forming an anti-stick layer on the first part comprises:
   applying a plasma treatment on the first bonding component to form a protection layer on the first bonding component;
   forming the anti-stick layer on the films and the protection layer; and
   removing a part of the anti-stick layer from the protection layer.

3. The method of claim 2, wherein the plasma treatment is conducted under the following conditions: a plasma reaction chamber is filled with nitrogen that has a concentration in a range of 40% to 60%, the pressure inside the plasma reaction chamber is in a range of 0.35 Pa to 1 Pa, a Radio Frequency (RF) power is in a range of 150 W to 300 W, and a bias voltage is in a range of −310V to −290V, and wherein the protection layer is a nitrogen-containing metal compound layer.

4. The method of claim 2, wherein the anti-stick layer on the protection layer is removed by a heating process.

5. The method of claim 4, wherein a temperature range for the heating process is 360° C. to 440° C.

6. The method of claim 1, wherein the first bonding component is made of aluminum, and the second bonding component is made of germanium.

7. The method of claim 1, wherein the anti-stick layer is made of perfluorodecyltrichlorosilane (FDTS, $CF_3(CF_2)_7(CH_2)_2SiCl_3$).

8. The method of claim 1, wherein the first part further comprising:
   a substrate;
   a first insulation layer on the substrate; and
   a support component on the first insulation layer surrounding and connecting to the plurality of films,
   wherein the first insulation layer, the support component and the plurality of films form a cavity, and neighboring films are spaced apart from each other to form gaps connecting to the cavity, and when forming an anti-stick layer on the first part, the anti-stick layer are formed on the plurality of films through the gaps.

9. The method of claim 8, wherein the first part further comprising:
- a first contact component on a side of the first insulation layer facing the cavity; and
- a first conductive through-hole component going through the support component and a portion of the first insulation layer and connecting to the first contact component, with the first bonding component on the support component and connecting to the first conductive through-hole component.

10. The method of claim 1, wherein the second part comprises:
- a Complementary Metal Oxide Semiconductor (CMOS) device;
- a second insulation layer on the CMOS device, with the second bonding component on the second insulation layer; a third insulation layer on a bottom surface of the CMOS device; a second contact component on the third insulation layer; a second conductive through-hole component going through the CMOS device and the third insulation layer and connecting to the second contact component; and
- a metal layer in the second insulation layer, with the CMOS device, the second conductive through-hole component, and the second bonding component each connecting to the metal layer.

11. A semiconductor device manufacturing method, comprising:
- providing a first semiconductor structure, comprising:
  - a first part comprising a plurality of films separated from each other; and
  - a first bonding component on the first part;
- forming a protection layer on the first bonding component;
- forming an anti-stick layer on the plurality of films and the protection layer;
- removing a portion of the anti-stick layer from the protection layer;
- providing a second semiconductor structure comprising a second part and a second bonding component on the second part; and
- bonding the first bonding component with the second bonding component, so that the first part is bonded to the second part.

12. A semiconductor device manufacturing method, comprising:
- providing a first semiconductor structure, comprising:
  - a first part comprising a plurality of films made of a semiconductor material and separated from each other; and
  - a first bonding component on the first part;
- forming an anti-stick layer directly on the plurality of films;
- providing a second semiconductor structure comprising a second part and a second bonding component on the second part; and
- bonding the first bonding component with the second bonding component, so that the first part is bonded to the second part.

* * * * *